(12) United States Patent
Han

(10) Patent No.: US 7,541,612 B2
(45) Date of Patent: Jun. 2, 2009

(54) MULTI-CHIP PACKAGE SEMICONDUCTOR DEVICE AND METHOD OF DETECTING A FAILURE THEREOF

(75) Inventor: Sang-Jib Han, Suwon-si (KR)

(73) Assignee: Sansumg Electronics Co., Ltd., Gyeonggi-do (KR)

( * ) Notice: Subject to any disclaimer, the term of this patent is extended or adjusted under 35 U.S.C. 154(b) by 45 days.

(21) Appl. No.: 11/593,517

(22) Filed: Nov. 7, 2006

(65) Prior Publication Data

US 2007/0108608 A1    May 17, 2007

(30) Foreign Application Priority Data

Nov. 16, 2005    (KR) ...................... 10-2005-0109443

(51) Int. Cl.
*H01L 23/58* (2006.01)
(52) U.S. Cl. ........................................ 257/48; 257/723
(58) Field of Classification Search .................... 257/48, 257/723, 734
See application file for complete search history.

(56) References Cited

U.S. PATENT DOCUMENTS 5,761,145 A * 6/1998 Zagar et al. .................. 365/226
6,356,498 B1 * 3/2002 Keeth .......................... 365/226

FOREIGN PATENT DOCUMENTS

| JP | 11-183548 | 7/1999 |
| JP | 2004-279160 | 10/2004 |
| KR | 10-2003-0019081 | 3/2003 |
| KR | 10-2004-0002441 | 1/2004 |
| KR | 10-2005-0073049 | 7/2005 |

* cited by examiner

*Primary Examiner*—Roy K Potter
(74) *Attorney, Agent, or Firm*—Harness, Dickey & Pierce PLC

(57) ABSTRACT

A semiconductor chip may include at least one power supply pad for receiving an external power voltage, at least one input/output pad, an internal function block that may be configured to operate based on a power voltage to at least one of receive and transmit a signal through the input/output pad, and a mode set circuit that may enable or disable the power voltage by a mode set signal in an individual chip test mode.

8 Claims, 4 Drawing Sheets

MULTI-CHIP PACKAGE SEMICONDUCTOR DEVICE AND METHOD OF DETECTING A FAILURE THEREOF

PRIORITY STATEMENT

This U.S. non-provisional application claims priority under 35 U.S.C. § 119 to Korean Patent Application No. 2005-109443, filed on Nov. 16, 2005 in the Korean Intellectual Property Office (KIPO), the entire contents of which are incorporated herein by reference.

BACKGROUND

1. Field

Example embodiments relate to a multi-chip package (MCP) semiconductor device and a method of detecting a failure thereof, for example, an apparatus and a method of detecting a failure of respective chips in the multi-chip package semiconductor device.

2. Description of the Related Art

The demand for electronic devices to be lighter, thinner, and overall smaller-sized electronic devices may be rapidly increasing. Therefore, a semiconductor chip package may need to have a high integration level and be smaller in size. Accordingly, the semiconductor chip package may be implemented in a form of a multi-chip package where at least two chips may be laminated.

The at least two chips may be included in the multi-chip package so that the electronic devices, for example mobile phones, may be manufactured to be thinner and smaller size and through a simplified manufacturing process. The at least two chips in the multi-chip package may be of the same kind, but the at least two chips of may each be of a different kind. However, if chips of different kinds are combined in a multi-chip package, external connection terminals may be shared by the chips, and thus it is may be difficult to test the respective chips in the multi-chip package for failure using an external tester.

Conventional techniques for determining a disconnection of a bonding wire between internal chips and an external terminal may not detect a defect in current flowing through the logic blocks of the internal chips. For example, a defect in current flowing through the logic blocks may not be determined by simply identifying the connection between the internal chips and the external terminal through the wire.

In addition, a technique for individually testing the respective chips under external control may be required to more precisely perform a test for detecting failure in the multi-chip package semiconductor device without damaging the package.

SUMMARY

Example embodiments may provide a multi-chip package semiconductor device and a method that may detect a failure in respective semiconductor chips of a multi-chip package.

Example embodiments may provide a semiconductor chip that may be capable of detecting a failure of the chip individually if the semiconductor chip is configured within a multi-chip package.

In an example embodiment, a semiconductor device may include at least one power supply pad for receiving an external power voltage, at least one input/output pad, an internal function block that may be configured to operate based on a power voltage and may be configured to at least one of receive and transmit a signal through the input/output pad, and a mode set circuit that may be configured to enable or disable the power voltage based on a mode set signal in an individual chip test mode.

According to an example embodiment, an internal power supply circuit may be configured to generate an internal power voltage based on the external power voltage provided through the at least one power supply pad, wherein the internal function block may be configured to operate based on the internal power voltage, and the mode set circuit may be configured to enable or disable the internal power supply circuit.

According to an example embodiment, a switching unit may be coupled between the internal function block and a first power supply pad of the at least one power supply pad, and the internal function block may be configured to be operated based on the external power voltage, and the mode set circuit may be configured to turn on or turn off the switching unit.

According to an example embodiment, the first power supply pad may correspond to a high level power supply pad, and the switching unit may be a PMOS transistor.

According to an example embodiment, the first power supply pad may correspond to a low level power supply pad, and the switching unit may be an NMOS transistor.

According to an example embodiment, a multi-chip package semiconductor device may include a plurality of semiconductor chips; a power supply terminal that may be configured to commonly couple the power supply pads of the plurality of semiconductor chips to an external device; and a signal terminal that may be configured to commonly couple the input/output pads of the plurality of semiconductor chips to the external device.

In an example embodiment, a method of detecting a failure in semiconductor chips of a multi-chip package semiconductor device may include commonly providing power to the semiconductor chips of the multi-chip package semiconductor device through a power supply terminal; setting one of the semiconductor chips to a disabled state and the rest of the semiconductor chips to a enabled state based on a test mode set signal; measuring a current running through the power supply terminal that may be commonly coupled to the semiconductor chips; and determining a failure of the disabled semiconductor chip by comparing the measured current and a normal current corresponding to a normal operation state.

According to an example embodiment, setting one of the semiconductor chips to a disabled state may include preventing an internal power voltage from being provided to an internal function block of the disabled semiconductor chip; and allowing the internal power voltage to be provided to the internal function block of the enabled semiconductor chips.

According to an example embodiment, the semiconductor chips may be sequentially set to a disabled state, and measuring current flowing through the power supply terminal and determining failure of the individually disabled semiconductor chip for the rest of the semiconductor chips may be repeated for each disabled semiconductor chip.

BRIEF DESCRIPTION OF THE DRAWINGS

Example embodiments will be described with reference to the accompanying drawings.

DESCRIPTION OF EXAMPLE EMBODIMENTS

Figure 1:
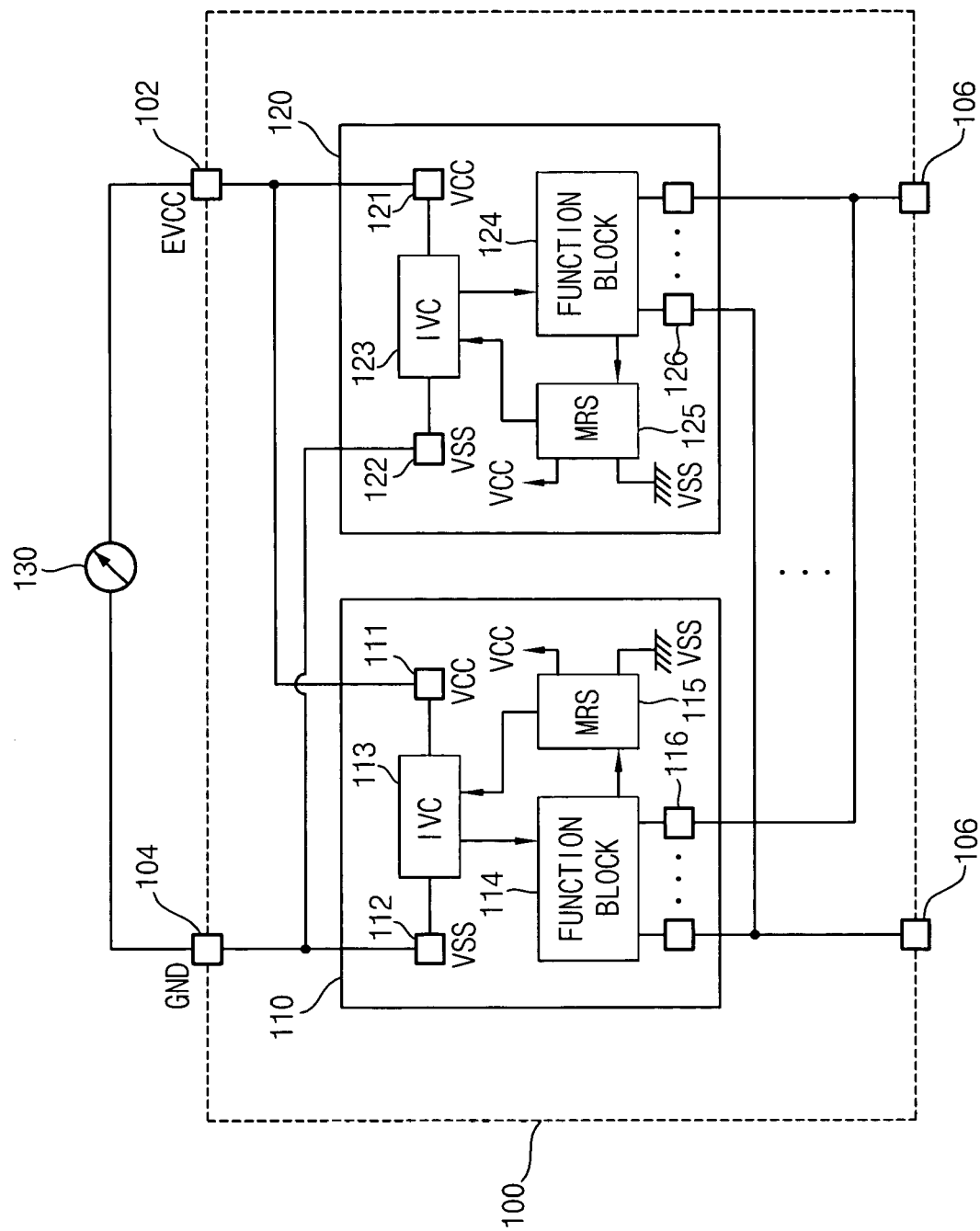
FIG. 1 is a block diagram of a multi-chip package semiconductor device according to an example embodiment.

Example embodiments now will be described more fully with reference to the accompanying drawings. The example embodiments may, however, be embodied in many different forms and should not be construed as limited to the example embodiments set forth herein. Rather, these example embodiments are provided so that this disclosure will be thorough and complete. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a multi-chip package (MCP) semiconductor device according to an example embodiment.

Referring to FIG. 1, an MCP semiconductor device 100 may include power supply terminals 102 and 104, a signal terminal 106, and/or semiconductor chips 110 and 120 that may be sealed by resin to construct a single package.

The semiconductor chip 110 may include pads 111 and 112 of power supply voltages VCC and VSS, an internal power supply circuit 113, an internal function block 114, a mode set circuit 115 and/or an input/output pad 116.

The semiconductor chip 120 may include pads 121 and 122 of the power supply voltages VCC and VSS, an internal power supply circuit 123, an internal function block 124, a mode set circuit 125 and/or an input/output pad 126.

The power supply pads 111 and 121 may be commonly coupled to the power supply terminal 102 to receive a higher level power voltage EVCC. The power supply pads 112 and 122 may be commonly coupled to the power supply terminal 104 to receive a lower level power voltage GND. The input/output pads 116 and 126 may be commonly coupled to the signal terminal 106.

The internal power supply circuits 113 and 123 may be coupled between the power supply pads 111 and 112 and the power supply pads 121 and 122, respectively, to generate an internal power voltage IVC based on the external power voltage EVCC. The internal power supply circuits 113 and 123 may be enabled or disabled in response to a mode set signal that may be output from the mode set circuits 115 and 125. If the internal power supply circuits 113 and 123 are enabled, the internal power voltage IVC may be provided to the internal function block 114 and 124. If the internal power supply circuits 113 and 123 are disabled, the internal power voltage IVC may not be provided to the internal function block 114 and 124.

The internal function blocks 114 and 124 may perform given functions based on the internal power voltage IVC and may receive or transfer a signal through the input/output pads 116 and 126. In addition, the internal function blocks 114 and 124 may receive a mode set signal that may be provided from the outside and may transfer the mode set signal to the mode set circuit 115 and 125. For example, an internal function block may be a memory function block or a logic function block, but is not limited thereto.

Each of the mode set circuits 115 and 125 may include a power-up circuit and a latch circuit. In an initial power-on stage, the latch circuit of the mode set circuits may be latched to an enabled state by the power-up circuit. The latch circuit may transition to a disabled state or an enabled state in response to the mode set signal. The mode set circuits 115 and 125 may receive the power voltages VCC and VSS, respectively, and may continue to operate even if the internal power supply circuits 113 and 123, respectively, are disabled. For example, the mode set circuits 115 and 125 may have configuration similar to that of a mode set register(MSR) in a memory chip, for example, a synchronous DRAM (SDRAM).

If the power is provided in an initial driving state, the mode set signal input to the mode set circuits 115 and 125 may be at logic "1" so the output of the mode set circuits 115 and 125 may be at logic "1." Accordingly, the internal power supply circuits 113 and 123 may be enabled to provide the internal power voltage IVC to the internal function blocks 114 and 124.

If the mode set signal is set to logic "0" by a particular address combination, the output of the mode set circuits 115 and 125 may transition to logic "0." Accordingly, the internal power supply circuits 113 and 123 may be disabled so that the internal power voltage IVC may not be provided to the internal function blocks 114 and 124.

Thus, to detect a current failure in an individual chip of the MCP semiconductor device 100, an amperemeter 130 may be disposed between the power supply terminal EVCC 102 and a ground GND 104 to measure the current flowing.

Figure 2:
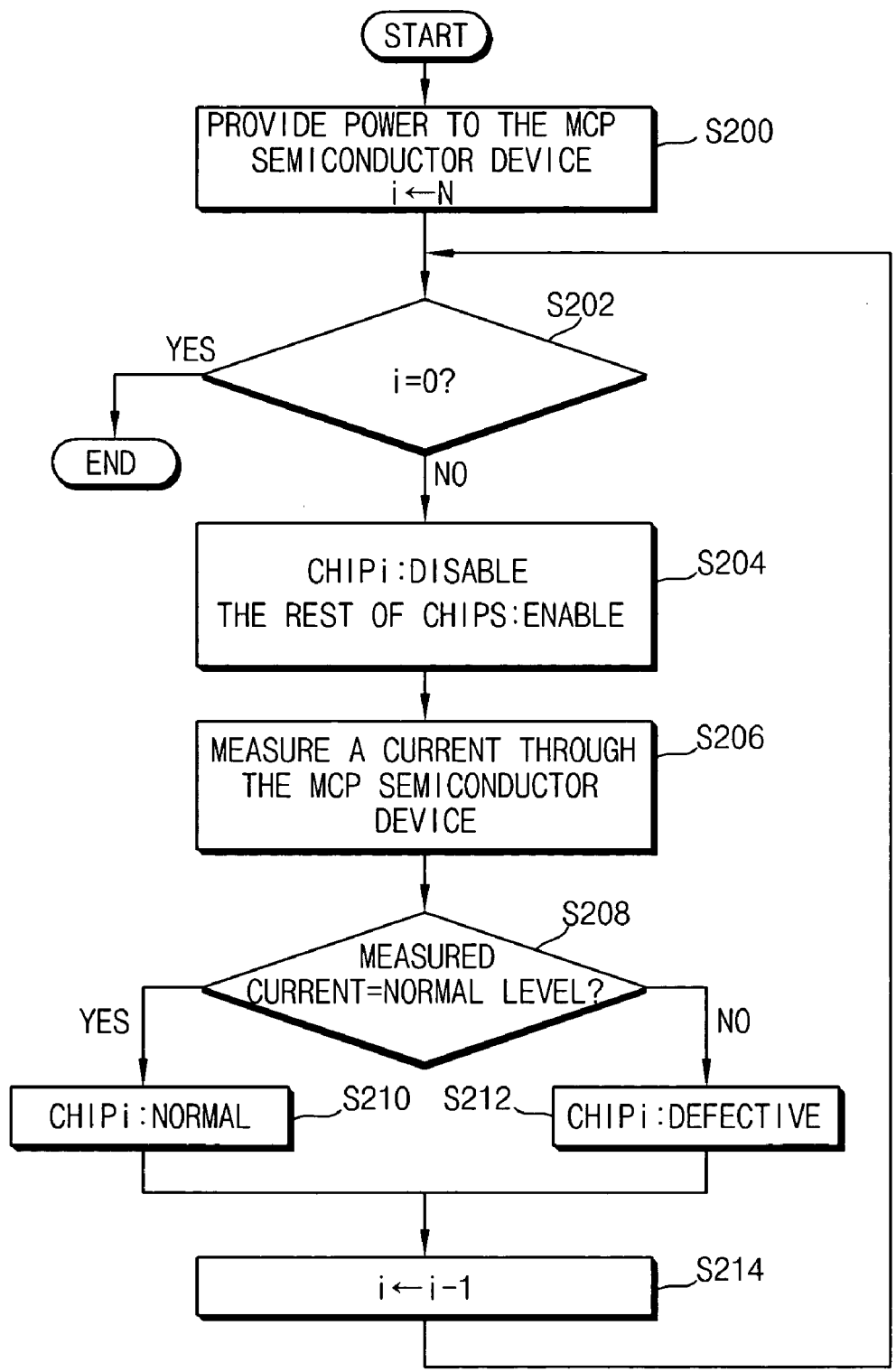
FIG. 2 is a flow chart of a method of detecting a failure of a multi-chip package semiconductor device according to an example embodiment.

FIG. 2 is a flow chart of a method of detecting a failure of a multi-chip package (MCP) semiconductor device according to an example embodiment. In an example embodiment, an MCP semiconductor device may be coupled to a tester (not shown).

Referring to FIGS. 1 and 2, a method of detecting the failure of an MCP semiconductor device according to an example embodiment, may include providing power to the MCP semiconductor device., and initializing a variable "i" to "N" (operation S200). For example, "N" may be the number of chips in the MCP semiconductor device.

It may be determined whether or not the variable "i" has a value of "0" (operation S202). If the variable "i" has a value of "0" (operation S202: YES), testing "N" chips of the MCP semiconductor device may be determined as being completed, so that a testing operation may be terminated. If the variable "i" does not have a value of "0" (operation S202: NO), a mode setting operation may be performed.

In the mode setting operation, the chips may be initially set in an enabled state. A chip corresponding to the variable "i" (i-th chip) may be disabled, and the rest of chips may be maintained in the enabled state (operation S204). For example, the internal power voltage IVC may not be provided to the internal function block of the i-th chip that may be disabled by the internal power supply circuit, and the internal power supply circuits of the rest of chips may be maintained at an enabled state so that the internal power voltage IVC may be provided to the internal function block of the rest of chips.

In an individual chip test mode, all the chips may be maintained in a stand-by mode and the current flowing through the power supply terminal may be measured by the amperemeter (operation S206). If the i-th chip is normal, a normal current that may be the sum of stand-by currents of the chips except the i-th chip may be measured by the amperemeter. If the i-th chip is not normal (e.g., when failure occurs in the i-th chip), the internal power circuit of the i-th chip may operate abnormally to provide power to the internal function block even though the internal power circuit of the i-th chip may be disabled by the mode setting operation. Therefore, the standby current may also be generated by the i-th chip if the i-th chip has a defect. For example, the current measured by the amperemeter may be the sum of the stand-by currents of all the chips in the MCP semiconductor device, and thereby may be greater than the normal current.

A current value that may be measured in operation S206 may be compared with a normal current value (operation S208). If the measured current value is equal to the normal current value (operation S208: YES), the i-th chip may be determined as being normal (operation S210). If the measured current value is not equal to the normal current value (operation S208: NO), the i-th chip may be determined as being defective (operation S212).

If the i-th chip is tested, the variable "i" may be decreased by "1" (operation S214) so as to sequentially test the next chip. The above procedure may be repeated to test the (i−1)-th chip.

Therefore, by sequentially decreasing the variable "i," all of the chips may be tested and defective chips among a plurality of those may be determined by the above method.

Figure 3:
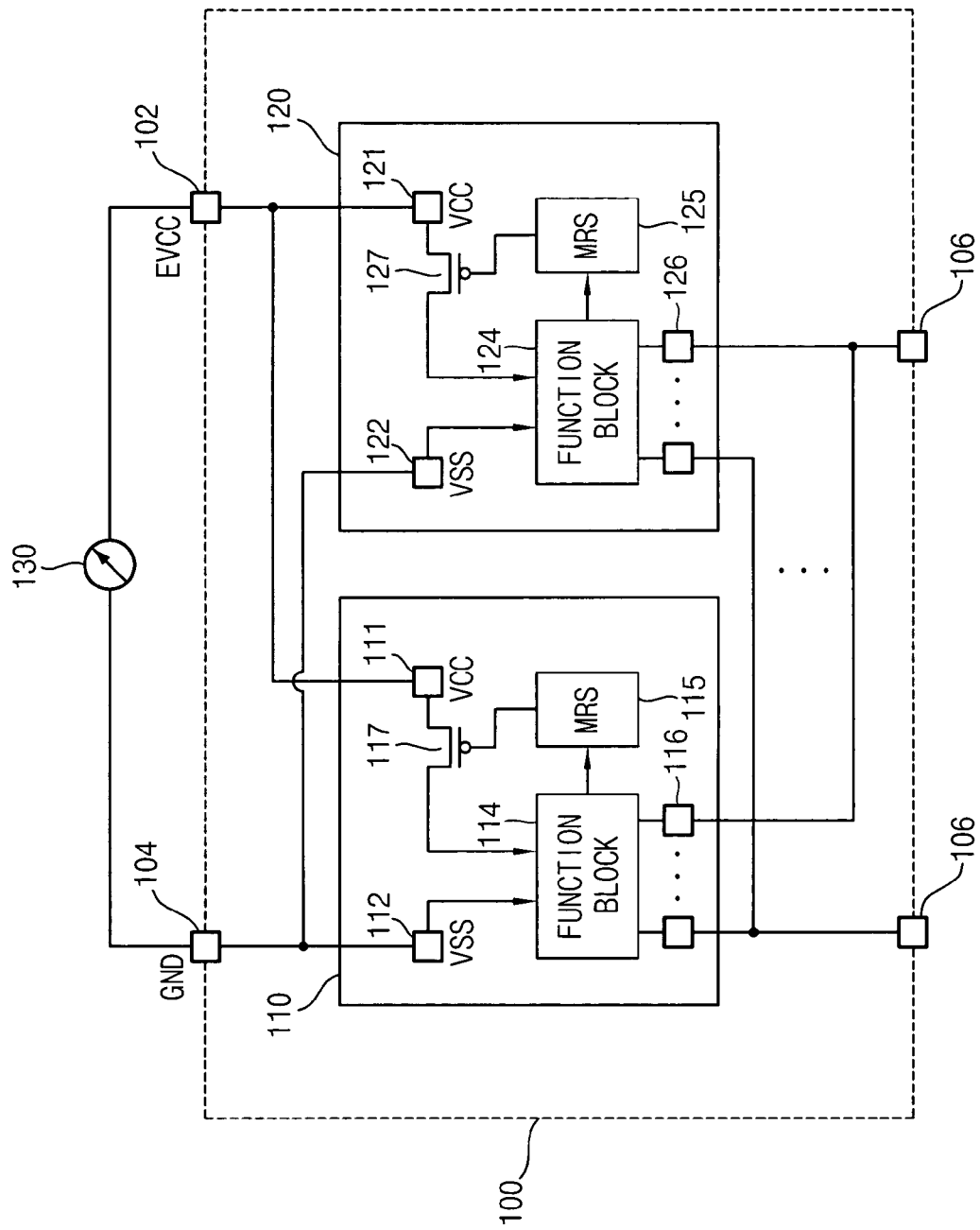
FIG. 3 is a block diagram of a multi-chip package semiconductor device according to an example embodiment.
Figure 4:
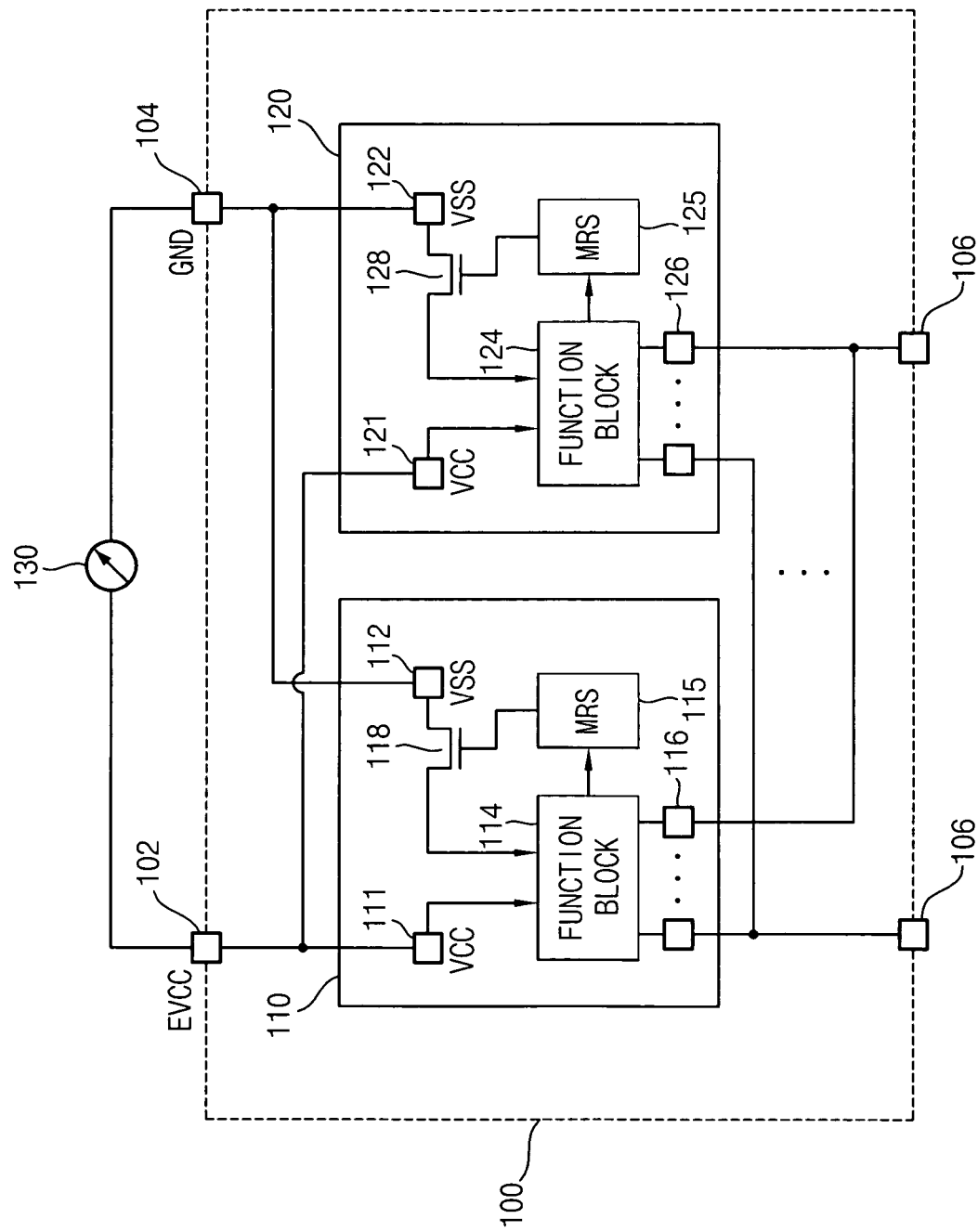
FIG. 4 is a block diagram of a multi-chip package semiconductor device according to an example embodiment.

FIGS. 3 and 4 are block diagrams of a multi-chip package semiconductor device according to example embodiments.

The same or like reference numerals are used to refer to the same or like elements as those described in the example embodiment in FIG. 1 and any repeated explanation will be omitted. In the MCP semiconductor devices of FIGS. 3 and 4, the internal power supply circuit may not be included.

Referring to FIG. 3, an MCP semiconductor device may include PMOS transistors 117 and 127 that may be disposed between the power supply pads 111 and 121 and the internal function blocks 114 and 124, respectively, to switch on and off the connection from the power supply voltage VCC to the function blocks 114 and 124. Control signals that may be output from the mode set circuits 115 and 125 may be applied to gates of the PMOS transistors 117 and 127, respectively. Each of the PMOS transistors 117 and 127 may be turned on in response to the corresponding control signal having a logic low level and may be turned off in response to the corresponding control signal having a logic high level. For example, if chip 110 is tested, the PMOS transistor 117 of the chip 110 may be turned off and the PMOS transistor 127 of the chip 120 may be turned on.

Referring to FIG. 4, an MCP semiconductor device may include NMOS transistors 118 and 128 that may be disposed between the power supply pads 112 and 122 and the internal function blocks 114 and 124, respectively, to switch on and off the connection from the power supply voltage VSS to the function blocks 114 and 124. Control signals that may be output from the mode set circuits 115 and 125 may be applied to gates of the NMOS transistors 118 and 128, respectively. Each of the NMOS transistors 118 and 128 may be turned on in response to the corresponding control signal having a logic high level and may be turned off in response to the corresponding control signal having a logic low level. For example, if chip 110 is tested, the NMOS transistor 118 of the chip 110 may be turned off and the NMOS transistor 128 of the chip 120 may be turned on.

Thus, the chips 110 and 120 may be independently enabled or disabled by controlling the switching transistors, which may be disposed in power supplying paths to the internal function blocks and which may operate in response to the control signals from the mode set circuits 115 and 125. The mode set circuits 115 and 125 may output the control signals in response to the mode set signal.

According to an example embodiment, the internal power supply circuits of the semiconductor chips may be independently enabled or disabled by using an externally provided mode set signal, so that the chips of the multi-chip package semiconductor device may be tested.

Although example embodiments have been described above, it is to be understood that the appended claims are not to be limited by particular details set forth in the above description as many apparent variations thereof are possible without departing from the spirit or scope thereof as hereinafter claimed.

What is claimed is:

1. A semiconductor chip comprising:
   at least one power supply pad;
   at least one input/output pad;
   an internal power supply circuit configured to generate an internal power voltage based on an external power voltage provided through the at least one power supply pad;
   an internal function block configured to operate based on the internal power voltage and configured to at least one of receive and transmit a signal through the at least one input/output pad; and
   a mode set circuit configured to enable or disable the internal power voltage based on a mode set signal in an individual chip test mode.

2. The semiconductor chip of claim 1, wherein the mode set circuit is configured to enable or disable the internal power supply circuit.

3. A multi-chip package semiconductor device comprising:
   a plurality of the semiconductor chips of claim 2;
   a power supply terminal configured to commonly couple the power supply pads of the plurality of semiconductor chips to an external device; and a signal terminal configured to commonly couple the input/output pads of the plurality of semiconductor chips to the external device.

4. A semiconductor chip, comprising:
   at least one power supply pad for receiving an external power voltage;
   at least one input/output pad;
   an internal function block configured to operate based on the internal power voltage and configured to at least one of receive and transmit a signal through the at least one input/output pad;
   a switching unit coupled between the internal function block and a first power supply pad of the at least one power supply pad; and
   a mode set circuit configured to enable or disable the internal power voltage based on a mode set signal in an individual chip test mode,
   wherein the internal function block is configured to operate based on the external power voltage and the mode set circuit is configured to turn on or turn off the switching unit,
   and wherein at least one power supply pad corresponds to a higher level power supply pad, and the switching unit is a PMOS transistor.

5. A semiconductor chip, comprising:
   at least one power supply pad for receiving an external power voltage;
   at least one input/output pad;
   an internal function block configured to operate based on the internal power voltage and configured to at least one of receive and transmit a signal through the at least one input/output pad;
   a switching unit coupled between the internal function block and a first power supply pad of the at least one power supply pad; and
   a mode set circuit configured to enable to disable the internal power coltage based on a mode set signal in an individual chip test mode,
   wherein the internal function block in configured to operate based on the external power voltage and the mode set circuit is configured to turn on or turn off the switching unit,
   and wherein the first power supply pad corresponds to a lower level power supply pad and the switching unit is an NMOS transistor.

6. A multi-chip package semiconductor device, comprising:
   a plurality of the semiconductor chips claim 4;
   a power supply terminal configured to commonly couple the power supply pads of the plurality of semiconductor chips to an external device; and
   a signal terminal configured to commonly couple the input/output pads of the plurality of semiconductor chips to the external device.

7. A multi-chip package semiconductor device, comprising:
   a plurality of semiconductor chips, each of the semiconductor chips including,
   a power supply pad;
   an input/output pad;
   an internal power supply circuit configured to generate an internal power voltage based on an external power voltage provided through the power supply pad;
   an internal function block configured to be operated by the internal power voltage to receive and/or transmit a signal through the input/output pad; and
   a mode set circuit configured to at least one of enable and disable the internal power supply circuit based on a mode set signal in an individual chip test mode;
   a power supply terminal configured to commonly couple the power supply pad of the respective semiconductor chip to an external device; and
   a signal terminal configured to commonly couple the input/output pad of the respective semiconductor chip to the external device.

8. A multi-chip package semiconductor device, comprising:
   a plurality of the semiconductor chips of claim 5;
   a power supply terminal configured to commonly couple the power supply pads of the plurality of semiconductor chips to an external device; and
   a signal terminal configured to commonly couple the input/output pads of the plurality of semiconductor chips to the external device.

* * * * *

UNITED STATES PATENT AND TRADEMARK OFFICE
CERTIFICATE OF CORRECTION

PATENT NO. : 7,541,612 B2
APPLICATION NO. : 11/593517
DATED : June 2, 2009
INVENTOR(S) : Sang-Jib Han It is certified that error appears in the above-identified patent and that said Letters Patent is hereby corrected as shown below:

Title Page, Item (73) should read:

(73) Assignee: Samsung Electronics Co., Ltd.,

Gyeonggi-do (KR)

Signed and Sealed this

Fourth Day of August, 2009

JOHN DOLL
*Acting Director of the United States Patent and Trademark Office*